US005726093A

United States Patent [19]
Yoo

[11] Patent Number: 5,726,093
[45] Date of Patent: Mar. 10, 1998

[54] TWO-STEP PLANER FIELD OXIDATION METHOD

[75] Inventor: Chue-san Yoo, Hsin-Chu, Taiwan

[73] Assignee: Taiwan Semiconductor Manufacturing Company Ltd., Hsin-Chu, Taiwan

[21] Appl. No.: 569,329

[22] Filed: Dec. 6, 1995

[51] Int. Cl.$^6$ .................................................. H01L 21/76
[52] U.S. Cl. ........................ 438/443; 438/452; 438/449
[58] Field of Search ........................................ 438/443, 449, 438/452

[56] References Cited

U.S. PATENT DOCUMENTS

| | | | |
|---|---|---|---|
| 5,196,367 | 3/1993 | Lu et al. | 437/70 |
| 5,229,318 | 7/1993 | Straboni et al. | 437/69 |
| 5,256,895 | 10/1993 | Bryant et al. | 257/501 |
| 5,656,537 | 8/1997 | Iwamatsu et al. | |

FOREIGN PATENT DOCUMENTS 1437112  5/1976  United Kingdom .

*Primary Examiner*—George R. Fourson
*Attorney, Agent, or Firm*—George O. Saile; Stephen B. Ackerman

[57] ABSTRACT

A method for the fabrication of semicondictor devices is disclosed, having a field oxide isolation which is co-planar with the adjacent silicon surface and which introduces lower mechanical stresses in the adjacent silicon than prior methods which seek co-planarity by removal of silicon by anisotropic etching methods. Instead, the excess silicon is removed by oxidation followed by selective oxide removal. A silicon substrate is provided and a multilayer oxidation mask is formed on it's surface consisting of a thin thermal oxide and a thicker film of silicon nitride. the mask is patterned by standard photolithographic methods and the field oxide region is pieced by selective reactive-ion-etching. The silicon is not penetrated in this step as it is in prior art. Instead a layer of silicon oxide it thermally grown to a thickness dependent upon the final field oxide thickness. This oxide is then unidirectionally etched to the silicon interface, leaving side pockets. A second oxidation is then performed to form the field oxide The oxidation mask is then removed by chemical etching. Semiconductor devices are subsequently formed in the regions adjacent to the field oxide. At no point in the process does thermal oxidation of sharp silicon edges occur. Thus the high intrinsic stresses which can lead to deep dislocations in the silicon, are avoided. Further, the presence of the side-pockets, to a great extent, inhibit lateral growth during the second oxidation.

14 Claims, 3 Drawing Sheets

TWO-STEP PLANER FIELD OXIDATION METHOD

BACKGROUND OF THE INVENTION

(1) Field of the Invention

The invention relates to processes for the manufacture of semiconductor devices and more particularly to processes for forming planar field isolation structures having low mechanical stress.

(2) Description of prior art

The formation of integrated circuit devices on flat silicon substrates results in the development local disruptions of the planarity of the exposed surface. In some cases this disruption is intentional and favorable, such as in instances when anisotropic etching techniques are employed. In other cases non-planar or topolocical surfaces can lead to photolithographic and interconnection problems above the silicon surface, and mechanical stress problems within it. A surface with minimum topology is always desirable after the masterslice processing complete. By far, the primary processes which produce non-planarity of the silicon surface, are those associated with the formation of areas for lateral device isolation. This involves the embedding of relatively thick pockets of insulating materials adjacent to the circuit devices. This is accomplished either, by growing a thick layer of thermal silicon oxide, or by depositing an insulating material into previously etched trenches.

The successful use of silicon for integrated circuits for the last fifty years can be, in part, attributed to the marvelous insulating properties of it's oxide. When silicon is converted to silicon oxide by thermal oxidation, however, the volume is doubled. When this is done in localized regions on a silicon wafer, as in the case for the formation of device isolation regions, considerable mechanical stresses are developed particularly at abrupt inside corners. These features in the silicon surface topology can result in the formation of dislocations. Above about 1000° C., viscous flow within the growing silicon oxide layer permits stresses due to volume expansion to be relieved. When the wafer is cooled, thermal stresses produced by the mismatch in expansion coefficients of the two materials are produced. These stresses are tensile in the silicon and have the potential to cause dislocations. Dislocations from thermal stresses alone, under a smooth silicon topology, are rarely seen, with very thick (in excess of 1 micron) oxide films. They can, however, augment the intrinsic stresses produced by oxides grown at temperatures below about 970° C. where insufficient viscous flow does not permit in-situ relief of volume expansion stresses in the growing silicon oxide film.

Bryant et al U.S. Pat. No. 5,256,895 describe a method for reducing penetration of the field oxide (Birds Beak), by providing a sidewall of silicon nitride to block the pad oxide layer from the field oxidation. The process step immediately before the field oxidation involves reactive ion etching or ion milling of the silicon nitride layer, stopping at the silicon surface. This completes the sidewall structure. Next, in order to embed the field oxide deeper and improve surface planarity, they continue the ion milling for about another 1000 Angstroms into the silicon, thereby providing a trench in which the field oxide is subsequently grown. The trench contains inside corners which, depending upon the subsequent oxidizing temperature and final field oxide thickness, can result in dislocations emanating from the corners and down at 45° angle into the region below the channel.

Others have discussed the development of defect producing mechanical stresses wherein silicon etching has taken place in order to lower the isolation oxide into the silicon. Mention such stresses is also made Straboni et. al. U.S. Pat. No. 5,229,318 who describe a method of incorporating a lowered oxide isolation region with minimal and controlled edge penetration utilizing plasma enhanced thermal nitridation. Their controlled edge oxidation could, as they claim, greatly minimize if not eliminate the "birds head", defined as the raised oxide region at edge the mask. Furthermore, the extent of the "birds beak" (the oxide below the edge of the mask) is also greatly reduced. The invention described here accomplishes edge control with two less processing steps.

A channel stopper implant is commonly done just prior to the field oxidation. This implant prevents the formations of an inversion layer in the silicon directly beneath the field oxide. It is particularly important for n-channel devices where the substrate consists of lightly doped p-type silicon. The implant is conventionally accomplished through a thin screen oxide into the surface of surface of the silicon. Subsequent oxidation to create the field oxide drives the implant ahead of the oxidation front, providing the desired channel stop. However the diffusion of implant also tends towards the region of the device channel. This has the effect of narrowing the channel and is detrimental to narrow channel devices. Lu et.al U.S. Pat. No. 5,196 367, have described a method for eliminating the encroachment of a channel stopper implant to the channel region by providing a photoresist spacer onto the edge of the field oxidation mask prior to the implant. The implant is then confined to a region further away from the device channel. The process described here provides such an implant spacer without any additional processing other than the implant step and it's associated screen oxide.

SUMMARY OF THE INVENTION

Accordingly, a method for fabricating a field oxide region for isolating integrated semiconductor devices is described wherein the said field oxide region is recessed so as to provide improved surface planarity and with minimal danger for stress induced dislocations. To accomplish this end a two-step field oxidation process is used. A mono-crystalline silicon wafer substrate is provided. A multilayer oxidation mask is formed to define area of the field oxide region. In it's simplest form, this consists of a layer of silicon nitride deposited onto a thin thermally grown pad oxide. The pattern is defined by standard photolithographic techniques and the mask is opened using reactive ion etching. After removal of the remaining photoresist, the first oxidation takes place to a thickness of slightly greater than that of the final required thickness. With the mask still in place, this oxide is anisotropically etched to the silicon surface, resulting in a trench. This trench, unlike that described by Bryant, does not have sharp inside corners in the silicon, but instead has a silicon oxide sidewall or pocket. The silicon-silicon oxide interface is smooth and continuous, extending up to the original silicon surface as the typical "birds beak". At this point the channel stop implant is incorporated, utilizing the silicon oxide sidewall pocket (the birds beak) as a spacer to keep the implant from encroaching into the channel region. Subsequently, the second oxidation takes place to the final desired field oxide thickness, the upper surface of the oxide now at or near the original surface plane. The masking layers are finally stripped by standard etching techniques and the field oxide is complete. Semiconductor devices such as high density VLSI MOS field effect transistor devices are then formed in the regions of the structure not covered by the field oxide.

FIG. shows the final cross-section of the field oxide after removal of the masking films by conventional isotropic etching. The effective spacer length is shown as $L_{BB}$.

Figure 7:
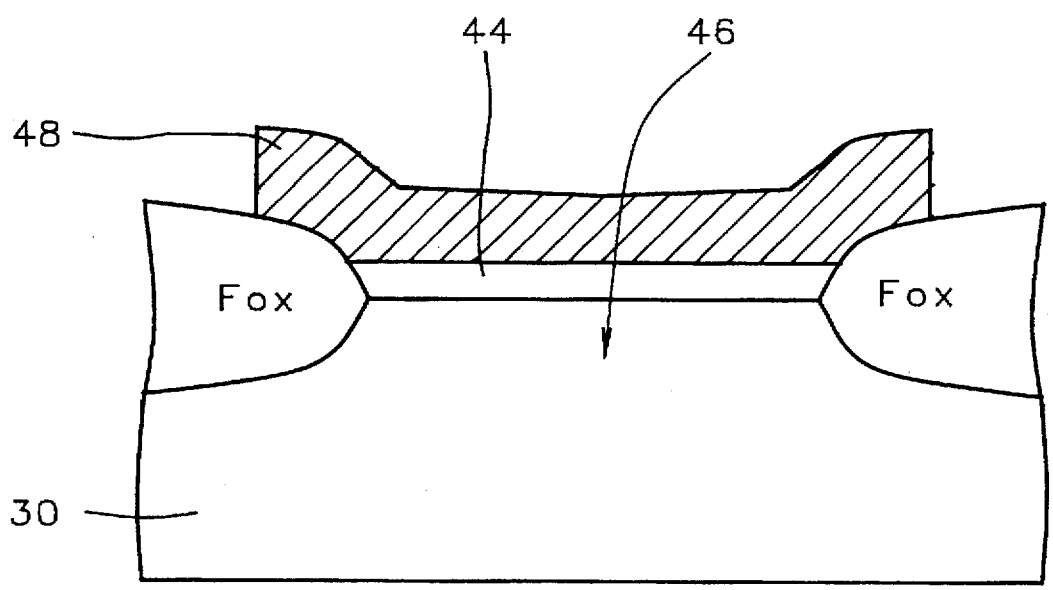

FIG. 7 shows a typical MOS field effect transistor formed in the space adjacent to field oxide regions. The source and drain structures are not shown but are understood by those skilled in the art to be at the ends of the channel above and below the paper respectively.

DESCRIPTION OF THE PREFERRED EMBODIMENTS

Figure 1:
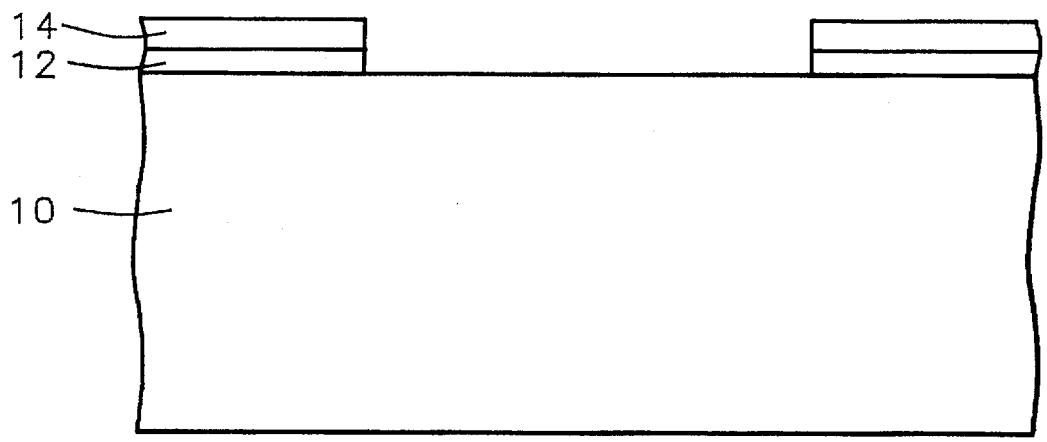
FIG. 1 shows a cross section of the deposited oxidation mask as defined by conventional photolithography. The photoresist has been removed and the wafer, 10, is ready for insertion into the oxidation furnance for the first oxidation. The film 12 is a thermal pad oxide and 14 is the silicon nitride oxidation barrier.

Referring now to FIG. 1, a P-doped<100> oriented monocrystalline silicon wafer 10 is used. The multi-layer oxidation mask is provided by first growing the thin pad oxide 12 to a thickness of typically 100 to 250 Angstroms, by subjecting the wafer to a clean dry oxidizing ambient in a furnance typically at 900° to 105° C. The silicon nitride layer 14 is then deposited, preferably by low-pressure-chemical-vapor-deposited (LPCVD) using silane or dichlorosilane and ammonia. Photoresist is then applied, exposed, and developed by state-of-the-art means thereby defining the pattern which will subsequently become the field oxide region. The oxidation mask is then opened to expose the silicon surface using conventional anisotropic etching techniques such as reactive-ion-etching. Appropriate etchants and conditions to provide high etch-rate-ratios are well known to those practicing this art such that the taper of the walls of the resultant opening can be well controlled, and the etching can be cleanly terminated at the silicon surface.

Figure 2:
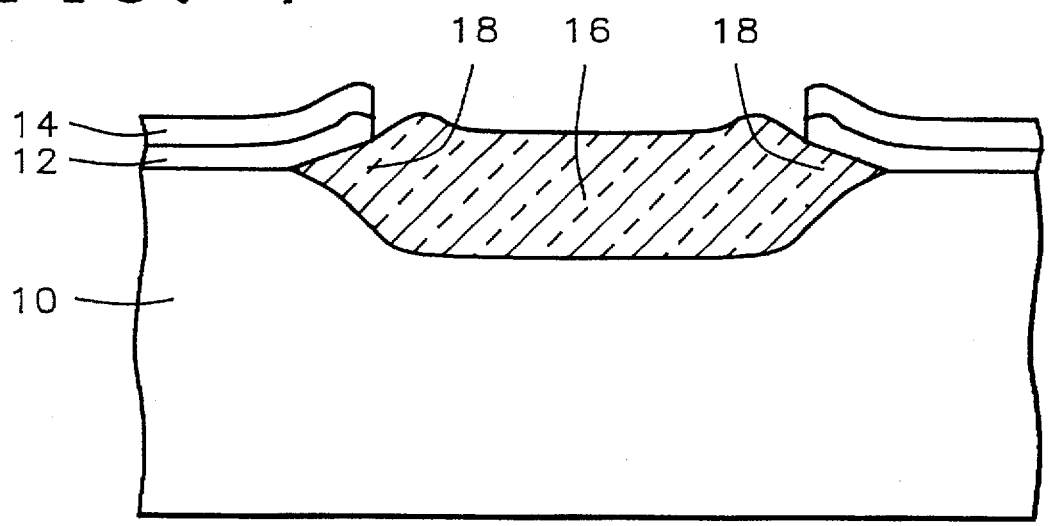
FIG. 2 Shows the cross section after the first oxidation. The edges of the mask are raised, having been pushed up by the lateral oxidation.

The first field oxidation is then accomplished in a clean oxidation furnance using an ambient gas containing oxygen, either alone in combination with water, or a chlorine containing additive such as trichloroethane to minimize mobile ion contamination. The oxidation temperature is typically between 900° to 1050° C. FIG. 2 shows the cross section after this oxidation. The thickness of this oxide layer 16 determined by the desired depth of the silicon surface for the second oxidation. This will be discussed in greater detail later. It is typically between 1000 and 3000 Angstroms. Note in the figure that the edges of the oxidation mask have been pushed up by the lateral growth of oxide. This lateral growth is typically referred to as Birds Beak and many process variations have been used and proposed to minimize and control it.

Figure 3:
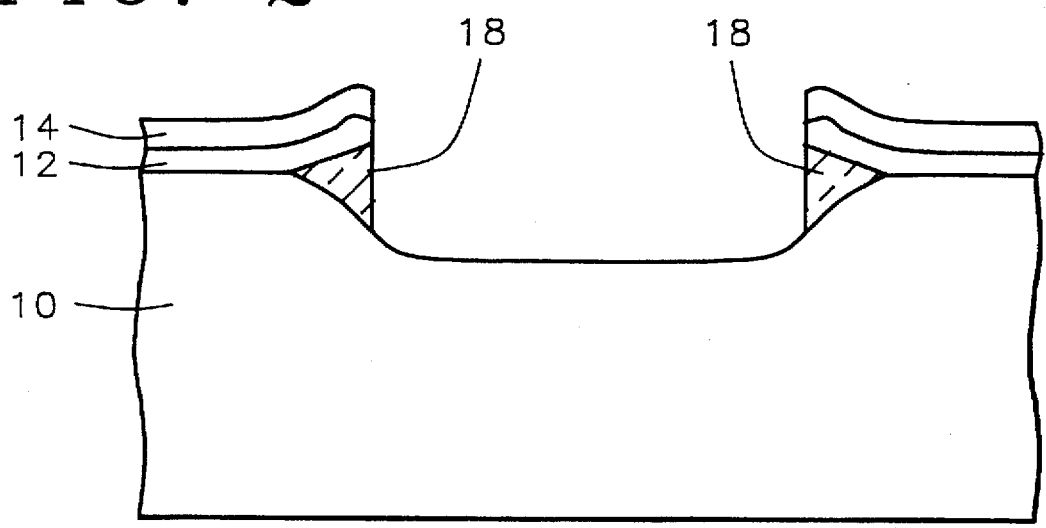
FIG. 3 is the same cross section after a unidirectional etch of the first oxide. The pockets 18 remain.

An opening is then made in the first oxidation as depicted in FIG. 3, using reactive-ion-etching(RIE) utilizing appropriate etchants and conditions to anisotropically etch the oxide layer entirely to the silicon surface but leaving the oxide pockets 18 along the sides of the depression. The taper of these pockets, which subsequently are used to define the channel stop implant can be tailored by the RIE, to expose more or less silicon.

Figure 4:
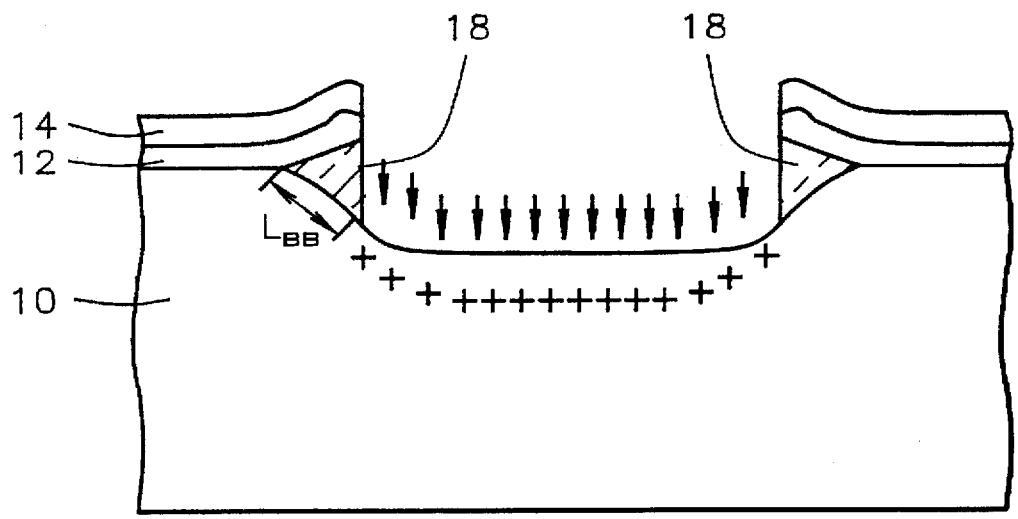
FIG. 4 shows the implantation of the channel stopper through a screen oxide (not shown) into silicon opened for the second oxidation.

At this point a channel stop is implant is incorporated, FIG. 4. A screen oxide of typically 100 to 200 Angstroms is grown and the implant is performed trough it. The sidewall pockets of silicon oxide serves as a spacer to keep the implant away from the channel.

Figure 5:
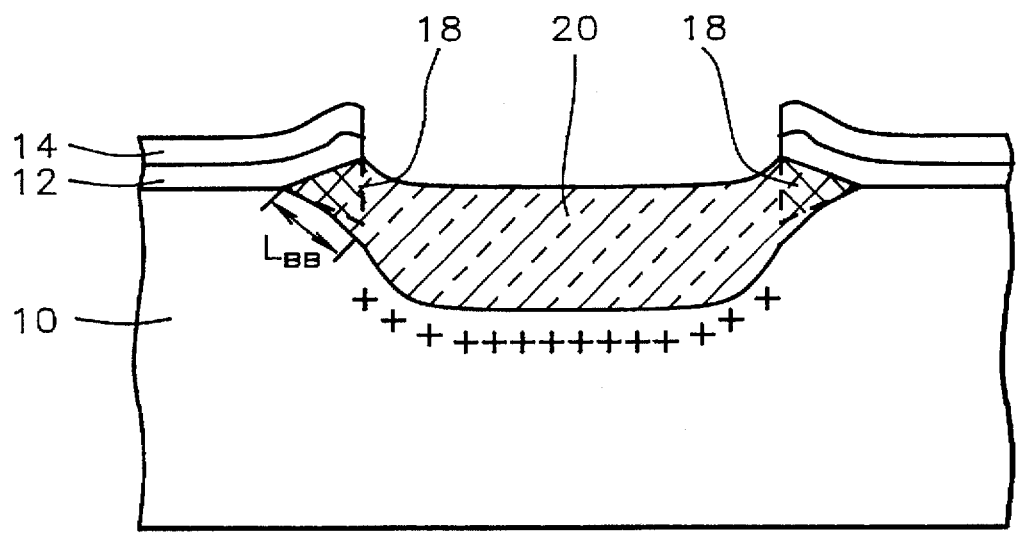
In FIG. 5 the second oxidation has taken place with minimal additional lateral translation due to the presence of the aforementioned oxide pockets.

The second oxidation FIG. 5 is then performed under similar conditions as the first. The side pockets remaining from the first oxidation are shown in cross-hatch. Because of the lateral masking action of by the first oxide on the second, the birds beak does not grow significantly in length. The channel stop diffusion is spaced both laterally and vertically away from the device channel region.

The thickness of this oxide 20 represents the final field oxide specification. The thickness of the first oxide 16 is dependent upon this specification in that the resulting planarity of the final surface depends upon the depth of the silicon in the depression after the removal of the first oxide 16.

The volume expansion for the oxidation of silicon is roughly a factor of 2.25 Thus, an oxide layer formed from 2500 Angstroms of silicon would be 2500×2.25=5625 Angstroms thick and lies 3125 Angstroms above the plane of the original silicon surface and 2500 Angstroms below. Accordingly, the thickness of the first oxide 16 should be about 1.25 times that of the second oxide 20 in order to achieve a final field oxide surface that is flush with the remaining silicon surface. As and example, if the desired final thickness of the field oxide is 5000 Angstroms, the initial oxidation must consume 5000×(2.25−)/2.25=2778 Angstroms of silicon, thereby lowering the silicon surface by that amount. The second oxidation will consume an additional 5000/2.25=2222 Angstroms of silicon, placing the 5000 Angstrom layer 20 flush with the surface. Empirically the factor 2.25 might be somewhat lower, especially for narrow structures where lateral oxidation is significant. The relationship for determination of the first oxide thickness is:

$$d_i = d_f(E_v - 1) \quad (1)$$

where $d_i$ is the thickness of the first oxide and $d_f$ is the thickness of the final field oxide. $E_v$ is the volume expansion factor for the oxidation of silicon which is approximately 2.25.

Figure 6:
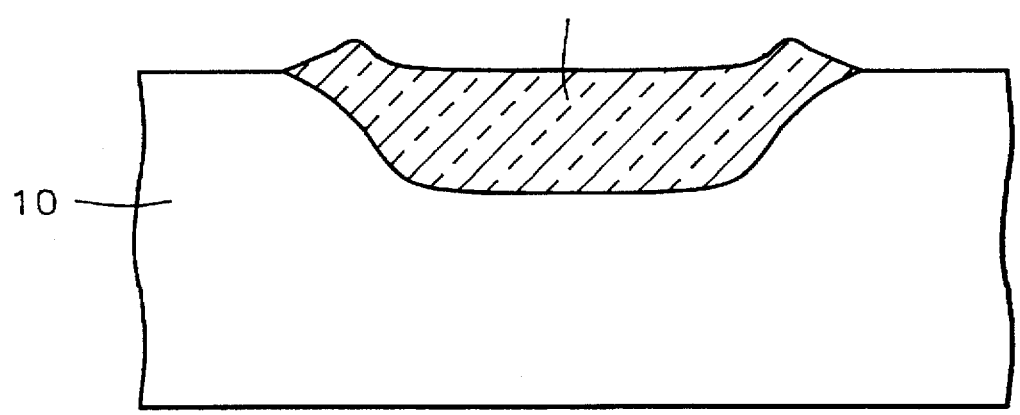

The films which comprised the oxidation mask can now be removed by conventional isotropic etchants. These will also tend to round off the slight protrusions of oxide which extend above the surface. The completed field oxide structure is shown in FIG. 6 where the composite consisting of the entire second oxidation plus the side pockets from the first oxidation are shown as one 22. Narrow channel MOS field effect transistor devices can now be fabricated in and over the silicon regions adjacent to the field oxide isolation patterns. Such a device is shown in FIG. 7 wherein a self-aligned channel 46 is formed between two field oxide isolation, FOX regions. A very thin gate silicon oxide layer 44 overlies the channel 46 and a conductive gate electrode 48 is positioned over the surface of the isolation, FOX and the gate silicon oxide layer 44. The source/drain regions as are understood by those skilled in the art are not shown but are located adjacent to the gate region into and out of the paper.

The embodiment of FIGS. 1 through 6 used a P-substrate. It should be well understood by those skilled in the art that N-type substrate conductivities may also be used. It should be further understood that the substrate conductivity type as referred to here does not necessarily refer to the conductivity of the starting wafer but could also be the conductivity of a diffused region within a wafer wherein a field oxide is to be incorporated.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a field isolation structure comprising:

providing a silicon semiconductor substrate;

forming a multilayer oxidation masking structure on said semiconductor substrate having a silicon oxide pad layer and a silicon nitride layer;

forming a mask in said multilayer oxidation masking structure by removing said silicon nitride layer and said silicon oxide pad layer over the regions where said field isolation structures are to be formed; oxidizing said regions of said semiconductor substrate to form a first oxide of said field oxide isolation structure;

etching said first oxide with an anisotropic etching technique to expose the (silicon) surface subjacent to the mask openings but retaining oxide pockets which are formed under the mask edge; growing a silicon oxide screen layer on the exposed silicon surface;

implanting dopant atoms under said silicon oxide screen layer to form a channel stop; and oxidizing to form a second oxide of said field oxide isolation structure the upper surface of which is co-planar with the adjacent silicon surface.

2. The method of claim 1 wherein the anisotropic etching technique for the removal of the first oxide of the field oxide isolation structure within the regions of the mask openings is reactive-ion-etching using conditions and etchants to achieve vertical etching.

3. The method of claim 1 wherein the thickness of the first oxide is determined from the second oxide thickness by the relationship: $d_i = d_f(E_v - 1)$ where $d_i$ is the thickness of the first oxide, $d_f$ is the thickness of the second oxide and $E_v$ is the volume expansion factor for the oxidation of silicon.

4. The method of claim 1 wherein the oxidation temperature for the formation of the first and second oxides of the field oxide isolation structure is between 900° C. and 1050° C.

5. The method of claim 1 wherein thickness of the first oxide of the field oxide isolation structure is between 1000 and 3000 Angstroms.

6. The method of claim 1 wherein the semiconductor substrate is P-type and the channel stop dopant is boron.

7. The method of claim 2 wherein conditions for the reactive-ion-etching are adjusted to tailor the profile of the oxide pockets to control the encroachment of the channel stop implant on device channel.

8. A method of fabricating semiconductor devices having field isolation structure comprising:

providing a silicon semiconductor substrate; forming a multilayer oxidation masking structure on the semiconductor substrate having a silicon oxide pad layer and a silicon nitride layer;

forming a mask in said multilayer oxidation masking structure by removing said silicon nitride layer and said silicon oxide pad layer over the regions where said field isolation structures are to be formed;

oxidizing said regions of said semiconductor substrate to form a first oxide of said field oxide isolation structure;

etching said first oxide with an an anisotropic etching technique to expose the silicon surface subjacent to the mask openings but retaining oxide pockets which are formed under the mask;

growing a silicon oxide screen layer on the exposed silicon surface;

implanting dopant atoms under said silicon oxide screen layer to form a channel stop; and oxidizing to form a second oxide of said field oxide isolation structure the upper surface of which is co-planar with the adjacent silicon surface;

removing the remaining multilayer oxidation mask; and forming semiconducting devices in the exposed silicon regions.

9. The method of claim 8 wherein the anisotropic etching technique for the removal of the first oxide of the field oxide isolation structure within the regions of the mask openings is reactive-ion-etching using conditions and etchants to achieve vertical etching.

10. The method of claim 1 wherein the thickness of the first oxide is determined from the second oxide thickness by the relationship: $d_i = d_f(E_v - 1)$ where $d_i$ is the thickness of the first oxide, $d_f$ is the thickness of the second oxide and $E_v$ is the volume expansion factor for the oxidation of silicon.

11. The method of claim 8 wherein the oxidation temperature for the formation of the first and second oxides of the field isolation structure is between 900° C. and 1050° C.

12. The method of claim 8 wherein thickness of the first oxide of the field oxide isolation structure is between 1000 and 3000 Angstroms.

13. The method of claim 8 wherein the semiconductor substrate is P-type and the channel stop dopant is boron.

14. The method of claim 9 whrein conditions for the reactive-ion-etching are adjusted to tailor the profile of the oxide pockets to control the encroachment of the channel stop implant on the device channel.

* * * * *